United States Patent
Li

(10) Patent No.: US 8,018,199 B2
(45) Date of Patent: Sep. 13, 2011

(54) CHARGE EVALUATING SYSTEM AND METHOD FOR A MOBILE PHONE

(75) Inventor: Ju-Mei Li, Tu-Cheng (TW)

(73) Assignee: Chi Mei Communication Systems, Inc., Tu-Cheng, New Taipei (TW)

( * ) Notice: Subject to any disclaimer, the term of this patent is extended or adjusted under 35 U.S.C. 154(b) by 736 days.

(21) Appl. No.: 12/168,866

(22) Filed: Jul. 7, 2008

(65) Prior Publication Data

US 2009/0108811 A1   Apr. 30, 2009

(30) Foreign Application Priority Data

Oct. 31, 2007   (CN) .......................... 2007 1 0202348

(51) Int. Cl.
*H01M 10/44* (2006.01)
*H01M 10/46* (2006.01)

(52) U.S. Cl. ........................................................ 320/132

(58) Field of Classification Search .................. 320/107, 320/114, 115, 116, 132, 149, DIG. 21; 324/426, 324/427, 430, 433
See application file for complete search history.

(56) References Cited

U.S. PATENT DOCUMENTS

| 4,820,966 A | * | 4/1989 | Fridman | 320/116 |
| 5,714,866 A | * | 2/1998 | S et al. | 320/152 |
| 2002/0171400 A1 | * | 11/2002 | Koyama et al. | 320/135 |

* cited by examiner

*Primary Examiner* — Edward Tso
(74) *Attorney, Agent, or Firm* — Altis Law Group, Inc.

(57) ABSTRACT

A charge evaluating method for a mobile phone is provided. The method includes calculating a final charge value A of a mobile phone battery when charging is complete according to a charge value prior to the battery being charged by the battery charger, a charge current value, a power dissipation value and a charging time. The method further includes converting the final voltage value to a final charge value B of the mobile phone battery, and displaying the final charge value A if the final charge value B is more than the final charge value A.

4 Claims, 4 Drawing Sheets

| Voltage value (mV) | Charge value (mA) |
|---|---|
| 3400 | 0 |
| 3654 | 109 |
| 3725 | 275 |
| 3779 | 550 |
| 3924 | 825 |
| 4160 | 1100 |

FIG.4

CHARGE EVALUATING SYSTEM AND METHOD FOR A MOBILE PHONE

BACKGROUND

1. Field of the Invention

Embodiments of the present disclosure relate to battery charging, and more particularly to a charge evaluating system and method for a mobile phone.

2. Description of Related Art

Nowadays, mobile phones are being widely used by more and more people. Because of their small size and low weight, mobile phones are easy to carry. Mobile phones typically require a battery to provide power for the mobile phone for a period of time known as the stand-by-time of the mobile phone. A charge of a battery of the mobile phone is used as a criterion to judge the stand-by time of the mobile phone.

A charge cycle of a mobile phone battery consists of three charge modes: a trickle mode, a constant current mode, and a constant voltage mode. The charge cycle starts with the trickle mode if a voltage value of the mobile phone battery is below a certain value, such as 2.8V, for example. The charge cycle moves to the constant current mode if a voltage value of the mobile phone battery is between 2.8V-4.2V, for example, and the charge cycle moves to the constant voltage mode if voltage of the mobile phone battery is more than 4.2V, for example. However, in the constant current mode, a voltage of the mobile phone battery may rise to 3.8V, for example in only a few minutes. If we convert the voltage of the mobile phone battery in constant current mode to a charge value, the charge value would actually be 38 percent more than actual charge value.

Accordingly, what is needed is a charge evaluating system and method for a mobile phone, which can evaluate the actual charge value of the mobile phone according to related parameters.

SUMMARY OF THE INVENTION

In one aspect, a charge evaluating system for a mobile phone is provided. The system includes a converting module, an obtaining module, a calculating module, an evaluating module, and a displaying module. The converting module is configured for obtaining a voltage value of the battery prior to the battery being charged by the battery charger upon the condition that the battery charger is activated to charge the battery, and configured for converting the voltage value to a charge value prior to the battery being charged by the battery charger. The obtaining module is configured for obtaining a charge current value of the battery from the battery charger. The calculating module is configured for calculating a power dissipation value of the battery, and for calculating a charging time of the battery by the battery charger. The evaluating module is configured for calculating a final charge value A of the battery upon the condition that a charging of the battery is complete, wherein the final charge value A is calculated according to the charge value prior to the battery being charged by the battery charger, the charge current value, the power dissipation value, and the charging time. The converting module is further configured for obtaining a final voltage value of the battery upon the condition that the charging of the battery is complete, and configured for converting the final voltage value to a final charge value B of the battery. The determining module is configured for determining if the final charge value B of the battery is more than the final charge value A. The displaying module is configured for displaying the final charge value A upon the condition that the final charge value B is more than the final charge value A, and for displaying the final charge value B upon the condition that the final charge value B is not more than the final charge value A.

Other systems, methods, features, and advantages will be or become apparent to one ordinary skills in the art upon examination of the following drawings and detailed description.

BRIEF DESCRIPTION OF THE DRAWINGS

FIG. 4 shows some examples of voltage values and their conversion to charge values.

DETAILED DESCRIPTION OF CERTAIN INVENTIVE EMBODIMENTS

Figure 1:
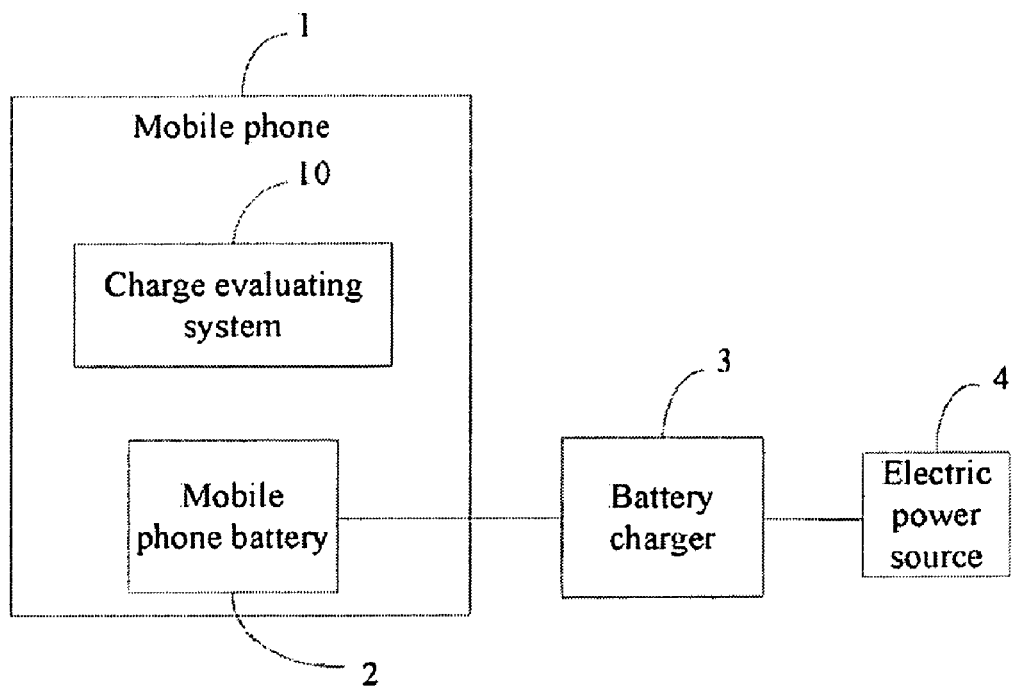
FIG. 1 is a block diagram of one embodiment of a charge evaluating system for a mobile phone.

FIG. 1 is a block diagram of one embodiment of a charge evaluating system for a mobile phone 1. The charge evaluating system 10 is incorporated in a mobile phone 1. The mobile phone 1 typically includes a mobile phone battery 2. The mobile phone battery 2 may be connected with a battery charger 3 that is connected to an electric power source 4 to charge the mobile phone battery 2.

Figure 2:
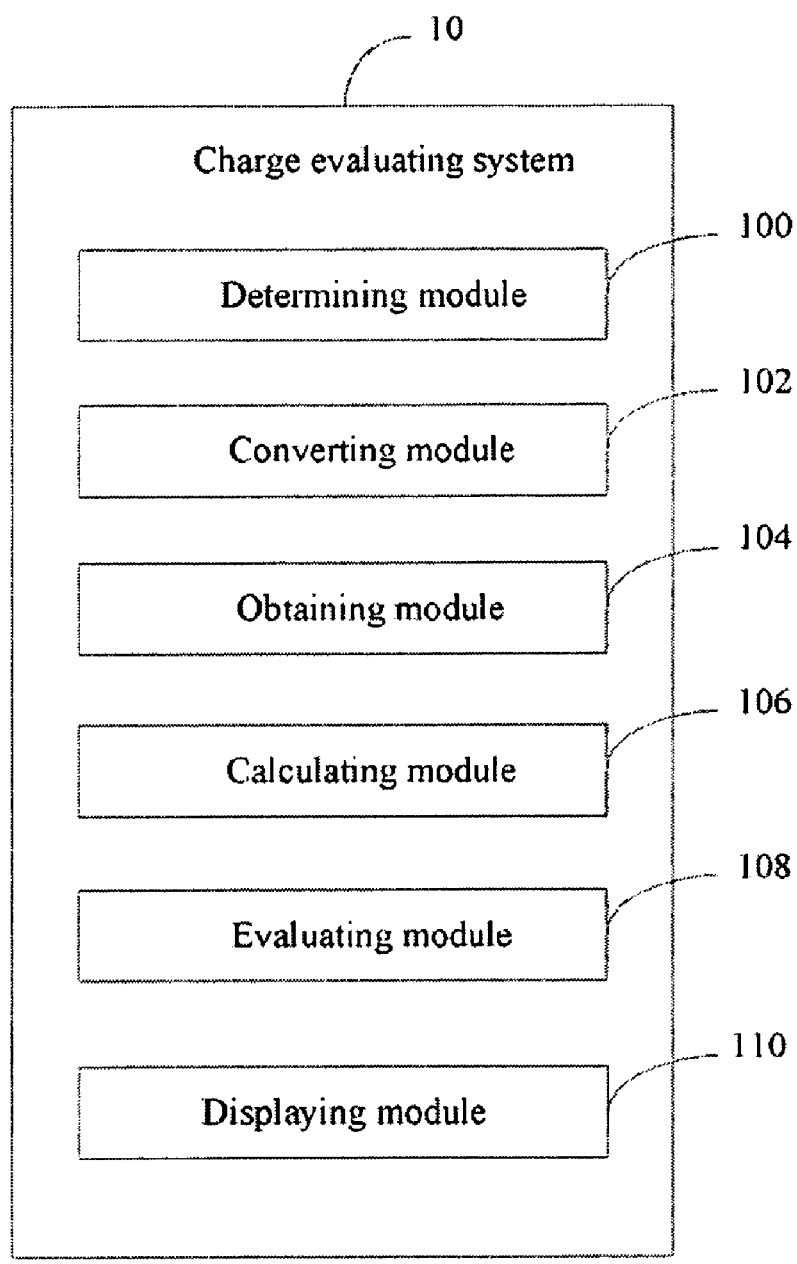
FIG. 2 is a block diagram of one embodiment of the charge evaluating system of FIG. 1 comprising software function modules.

FIG. 2 is a block diagram of one embodiment of the charge evaluating system 10 of FIG. 1 comprising software function modules. The software modules may be used to implement certain functions and will be described in greater detail below. In one embodiment, the charge evaluating system 10 includes a determining module 100, a converting module 102, an obtaining module 104, a calculating module 106, an evaluating module 108, and a displaying module 110.

The determining module 100 is configured for determining if the mobile phone battery 2 is being charged by the battery charger 3.

The converting module 102 is configured for obtaining a voltage value of the mobile phone battery 2 before the battery charger 3 charges the mobile phone battery 2. The obtaining the voltage value of the mobile phone battery 2 may occur when the battery charger 3 is activated to charge the mobile phone battery 2. The converting module 102 is further configured for converting the voltage value of the mobile phone battery 2 to a charge value before charging. Examples of voltage values and their conversion to charge values are displayed in a table in FIG. 4.

The obtaining module 104 is configured for obtaining a charge current value of the mobile phone battery 2 from the battery charger 3 for the evaluating module 108. In one embodiment, the charge current value is generally determined by the battery charger 3. However, it may be appreciated that different chargers may have different charge currents when they are used to charge mobile phone batteries.

The calculating module 106 is configured for calculating a power dissipation value of the mobile phone battery 2 and a charging time of the mobile phone battery 2 for the evaluating module 108.

The evaluating module 108 is configured for calculating a final charge value A of the mobile phone battery 2 when the battery charger 3 completes charging of the mobile phone battery 2. In one embodiment, the final charge value A of the mobile phone battery 2 may be determined according to the charge value before charging, the charge current value, the power dissipation value, and the charging time. It may be understood that the final charge value A of the mobile phone battery 2 may be according to the following equation: final charge A=charge value of the mobile phone battery 2 before charging+(charge current value−power dissipation value)*charging time. It may be understood that the charging time is equal to time difference between a start charging time and an end charging time. For example, if the start charging time is 2:00, the end start charging time is 3:00, then the charging time is 1 hour.

The converting module 102 is configured for obtaining a final voltage value of the mobile phone battery 2 when the charger completes charging of the mobile phone battery 2. The converting module 102 is further configured for converting the final voltage value to a final charge value B of the mobile phone battery 2. Examples of voltage values and their conversion to charge values are shown in the table in FIG. 4.

The determining module 100 is configured for determining if the final charge value B is more than the final charge value A.

The displaying module 110 is configured for displaying the final charge value A if the final charge value B is more than the final charge value A. The displaying module 110 is also configured for displaying the final charge value B if the final charge value B is not more than the final charge value A.

Figure 3:
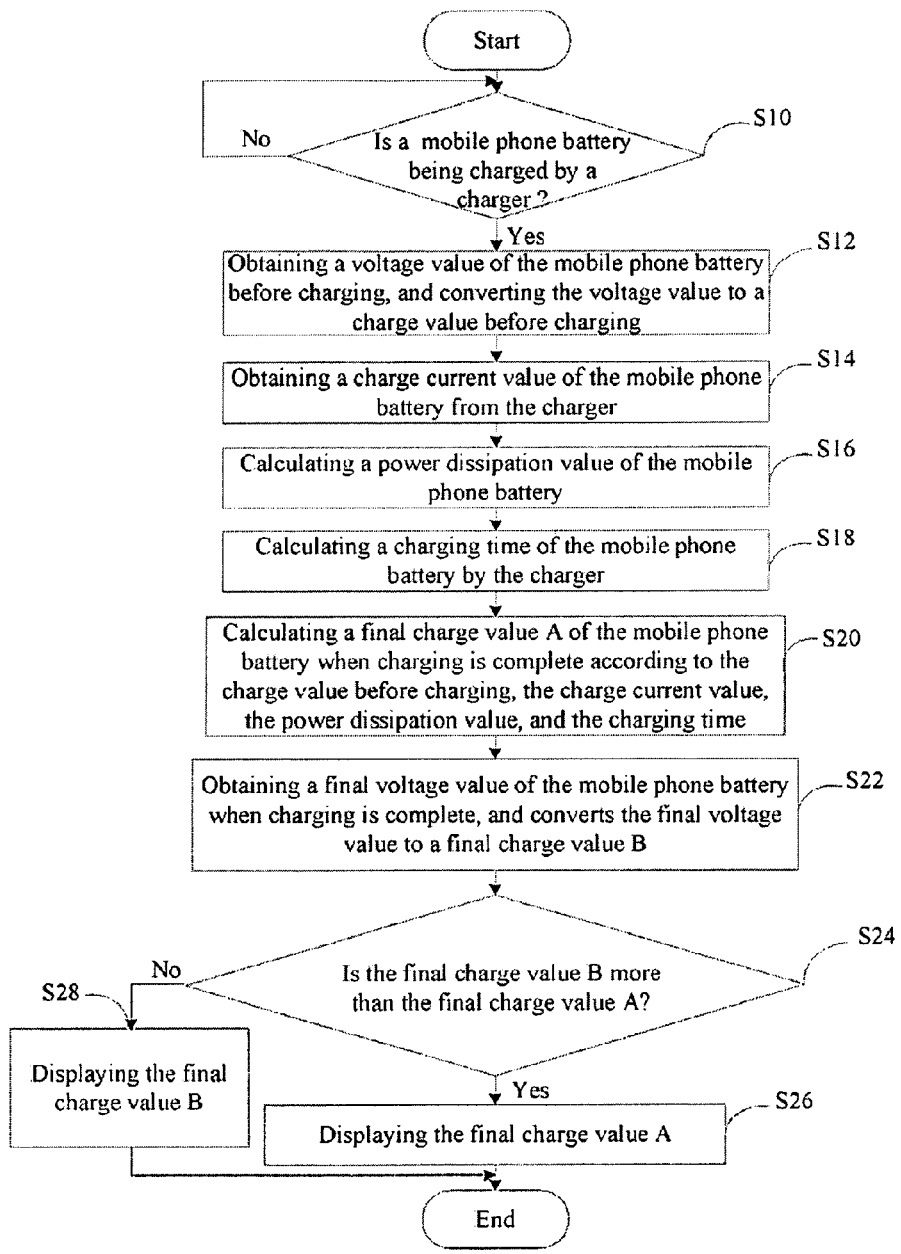
FIG. 3 is a flowchart illustrating one embodiment of a charge evaluating method for the mobile phone.

FIG. 3 is a flowchart illustrating one embodiment of a charge evaluating method for a mobile phone. The method of FIG. 3 may be used to evaluate a charge of a mobile phone so as to determine if the mobile phone needs to be recharged. Depending on the embodiment of FIG. 3, ordering of the blocks may be rearranged, blocks added, and others removed.

In block S10, the determining module 100 determines if the mobile phone battery 2 is being charged by the battery charger 3.

In block S12, the converting module 102 obtains a voltage value of the mobile phone battery 2 before the battery charger 3 charges the mobile phone battery 2. The converting module may convert the voltage value to a charge value before charging. As mentioned above, examples of voltage values and their conversions to charge values are shown in the table in FIG. 4.

In block S14, the obtaining module 104 obtains a charge current value of the mobile phone battery 2 from the battery charger 3 for the evaluating module 106.

In block S16, the calculating module 106 calculates a power dissipation value of the mobile phone battery 2 for the evaluating module 108.

In block S18, the calculating module 106 calculates a charging time of the mobile phone battery 2 by the battery charger 3 for the evaluating module 108.

In block S20, the evaluating module 108 calculates a final charge value A of the mobile phone battery 2 when the charger completes charging of the mobile phone battery 2. As mentioned above, the final charge value A of the mobile phone battery 2 may be determined according to the charge value before charging, the charge current value, the power dissipation value, and the charging time. It may be understood that the final charge value A of the mobile phone battery 2 may be according to the following equation: final charge A=charge value of the mobile phone battery 2 before charging+(charge current value−power dissipation value)*charging time.

In block S22, the converting module 102 obtains a final voltage value of the mobile phone battery 2 when the charging is complete by the battery charger 3, and converts the final voltage value to a final charge value B of the mobile phone battery 2 when charging is complete.

In block S24, the determining module 100 determines if the final charge value B is more than the final charge value A.

In block S26, if the final charge value B is more than the final charge value A, then the displaying module 110 displays the final charge value A. Otherwise, if the final charge value B is not more than the final charge value A, in block S28, then the displaying module 110 displays the final charge value B.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A charge evaluating system for a mobile phone, the mobile phone comprising a battery wherein the battery is charged via a battery charger, the charge evaluating system comprising:

a converting module configured for obtaining a voltage value of the battery prior to the battery being charged by the battery charger upon the condition that the battery charger is activated to charge the battery, and configured for converting the voltage value to a charge value prior to the battery being charged by the battery charger;

an obtaining module configured for obtaining a charge current value of the battery from the battery charger;

a calculating module configured for calculating a power dissipation value of the battery, and for calculating a charging time of the battery by the battery charger;

an evaluating module configured for calculating a final charge value A of the battery upon the condition that a charging of the battery is complete, wherein the final charge value A is calculated according to the charge value prior to the battery being charged by the battery charger, the charge current value, the power dissipation value, and the charging time;

the converting module further configured for obtaining a final voltage value of the battery upon the condition that the charging of the battery is complete, and configured for converting the final voltage value to a final charge value B of the battery;

a determining module configured for determining if the final charge value B of the battery is more than the final charge value A; and a displaying module for displaying the final charge value A upon the condition that the final charge value B is more than the final charge value A, and for displaying the final charge value B upon the condition that the final charge value B is not more than the final charge value A.

2. The charge evaluating system as claimed in claim 1, wherein the final charge value A of the battery is substantially equal to a result of an equation: the charge value+(the charge current value−the power dissipation value)*the charging time.

3. A charge evaluating method for a mobile phone, the mobile phone comprising a battery wherein the battery is charged via a battery charger, the method comprising:

obtaining a voltage value of the battery prior to the battery being charged by the battery charger upon the condition that a charger is activated to charge the battery, and converting the voltage value to a charge value prior to the battery being charged by the battery charger;

obtaining a charge current value of the battery from the battery charger;

calculating a power dissipation value of the battery;

calculating a charging time of the battery by the battery charger;

calculating a final charge value A of the battery upon the condition that a charging of the battery is complete, wherein the final charge A of the battery is calculated according to the charge value prior to the battery being charged by the battery charger, the charge current value, the power dissipation value, and the charging time;

obtaining a final voltage value of the battery upon the condition that the charging of the battery is complete, and converting the final voltage value to a final charge value B of the battery;

determining if the final charge value B of the battery is more than the final charge value A;

displaying the final charge value A upon the condition that the final charge value B is more than the final charge value A; and displaying the final charge value B upon the condition that the final charge value B is not more than the final charge value A.

4. The method as claimed in claim 3, wherein the final charge value A of the battery is substantially equal to a result of an equation: the charge value+(the charge current value−the power dissipation value)*the charging time.

* * * * *